(12) United States Patent
An

(10) Patent No.: US 12,382,822 B2
(45) Date of Patent: Aug. 5, 2025

(54) SUBSTRATE FOR DISPLAY DEVICE OR FLEXIBLE DISPLAY DEVICE, AND DISPLAY DEVICE OR FLEXIBLE DISPLAY DEVICE USING THE SAME

(71) Applicant: LG CHEM, LTD., Seoul (KR)

(72) Inventor: Kwang Hyeon An, Daejeon (KR)

(73) Assignee: LG CHEM, LTD., Seoul (KR)

(*) Notice: Subject to any disclaimer, the term of this patent is extended or adjusted under 35 U.S.C. 154(b) by 441 days.

(21) Appl. No.: 18/001,941

(22) PCT Filed: Nov. 5, 2021

(86) PCT No.: PCT/KR2021/016017
§ 371 (c)(1),
(2) Date: Dec. 15, 2022

(87) PCT Pub. No.: WO2022/108207
PCT Pub. Date: May 27, 2022

(65) Prior Publication Data
US 2023/0263046 A1 Aug. 17, 2023

(30) Foreign Application Priority Data

Nov. 19, 2020 (KR) .................. 10-2020-0155897
Nov. 1, 2021 (KR) .................. 10-2021-0148107

(51) Int. Cl.
*H10K 85/10* (2023.01)
*H10K 77/10* (2023.01)
*H10K 102/00* (2023.01)

(52) U.S. Cl.
CPC .......... *H10K 85/141* (2023.02); *H10K 77/10* (2023.02); *H10K 2102/311* (2023.02)

(58) Field of Classification Search
None
See application file for complete search history.

(56) References Cited

U.S. PATENT DOCUMENTS

| 11,999,823 | B2 | 6/2024 | Kim et al. |
| 2015/0183932 | A1 | 7/2015 | Katayama et al. |
| 2015/0210048 | A1 | 7/2015 | Jeong et al. |
| 2015/0232621 | A1 | 8/2015 | Jeong et al. |
| 2015/0239210 | A1 | 8/2015 | Jeong et al. |
| 2016/0040027 | A1 | 2/2016 | Woo et al. |
| 2016/0046103 | A1 | 2/2016 | Hong et al. |
| 2016/0168328 | A1 | 6/2016 | Takiue |
| 2016/0244565 | A1 | 8/2016 | Katayama et al. |
| 2017/0240707 | A1 | 8/2017 | Katayama et al. |
| 2018/0334541 | A1 | 11/2018 | Jeong et al. |
| 2019/0263095 | A1 | 8/2019 | Paek et al. |
| 2019/0292138 | A1 | 9/2019 | Yun et al. |
| 2020/0040152 | A1 | 2/2020 | Yun et al. |
| 2020/0148826 | A1 | 5/2020 | Park et al. |
| 2021/0115192 | A1 | 4/2021 | Yasumoto et al. |

FOREIGN PATENT DOCUMENTS

| CN | 102223760 A | 10/2011 |
| CN | 104685553 A | 6/2015 |
| CN | 109415301 A | 3/2019 |
| CN | 109496181 A | 3/2019 |
| CN | 110832015 A | 2/2020 |
| JP | 2006-192854 A | 7/2006 |
| JP | 2010-155360 A | 7/2010 |
| JP | 5478701 B2 | 4/2014 |
| JP | 2015-021022 A | 2/2015 |
| JP | 2016-145987 A | 8/2016 |
| JP | 2017-069200 A | 4/2017 |
| JP | 2018-103392 A | 7/2018 |
| JP | 2018-123319 A | 8/2018 |
| JP | 2020-003781 A | 1/2020 |
| JP | 2020-033421 A | 3/2020 |
| JP | 2020-125493 A | 8/2020 |
| JP | 2021-152157 A | 9/2021 |
| JP | 2022-121225 A | 8/2022 |
| KR | 10-2013-0074168 A | 7/2013 |
| KR | 10-2014-0120058 A | 10/2014 |
| KR | 10-2015-0023728 A | 3/2015 |
| KR | 10-1579645 B1 | 12/2015 |
| KR | 10-1773651 B1 | 8/2017 |
| KR | 10-2018-0128828 A | 12/2018 |
| KR | 10-2018455 B | 9/2019 |
| KR | 10-2020-0026322 A | 3/2020 |
| KR | 10-2094729 B | 3/2020 |
| TW | 201414610 A | 4/2014 |
| TW | 201425048 A | 7/2014 |
| TW | 201900392 A | 1/2019 |
| TW | 201938368 A | 10/2019 |
| WO | 2017051827 A1 | 3/2017 |
| WO | 2020004236 A1 | 1/2020 |
| WO | 2020159174 A1 | 8/2020 |

OTHER PUBLICATIONS

International Search Report issued for International Application No. PCT/KR2021/016017 on Mar. 4, 2022, 4 pages.
Extended European Search Report dated Sep. 13, 2023, of the corresponding European Patent Application No. 21894978.2, 7 pages.

*Primary Examiner* — Anthony Ho
(74) *Attorney, Agent, or Firm* — ROTHWELL, FIGG, ERNST & MANBECK, P.C.

(57) ABSTRACT

The present disclosure relates to a substrate for a display device or a flexible display device that realizes low dielectric properties and excellent heat resistance, and a display device or a flexible display device using the same.

15 Claims, No Drawings

US 12,382,822 B2

SUBSTRATE FOR DISPLAY DEVICE OR FLEXIBLE DISPLAY DEVICE, AND DISPLAY DEVICE OR FLEXIBLE DISPLAY DEVICE USING THE SAME

CROSS-REFERENCE TO RELATED APPLICATION(S)

This application is a 35 U.S.C. 371 National Phase Entry Application from PCT/KR2021/016017 filed on Nov. 5, 2021, which claims the benefits of Korean Patent Application No. 10-2020-0155897 filed on Nov. 19, 2020 and Korean Patent Application No. 10-2021-0148107 filed on Nov. 1, 2021 in the Korean Intellectual Property Office, the disclosures of which are incorporated herein by reference in their entirety.

TECHNICAL FIELD

The present disclosure relates to a substrate for a display device or a flexible display device that realizes high resistance characteristics and excellent heat resistance, and a display device or a flexible display device using the same.

BACKGROUND OF THE INVENTION

The display device market is rapidly changing based on flat panel displays (FPDs) that are easy to fabricate over a large area and can be reduced in thickness and weight. Such flat panel displays include liquid crystal displays (LCDs), organic light emitting displays (OLEDs), or electrophoretic devices (EPDs).

A rigid type display is manufactured using a glass substrate as a substrate. A flexible type display is manufactured using a plastic substrate as a substrate.

However, as a plastic substrate is applied to a flexible type display, problems such as a restoration afterimage appear. Also, the plastic substrate has a problem in that heat resistance, thermal conductivity and electrical insulation property are inferior as compared to those of the glass substrate.

Nevertheless, research is being actively conducted to apply a plastic substrate having the advantage of being lightweight, flexible, and capable of being manufactured by a continuous process, instead of a glass substrate, to a mobile phone, a notebook PC, a TV, and the like.

Polyimide resin is easily synthesized, can be manufactured as a thin film and has the advantage of being applicable to a high-temperature process. In line with the trend of lightweight and precision of various electronic devices, the polyimide resin is often applied to semiconductor materials as an integrated material. Particularly, much research is being conducted to apply the polyimide resin to a flexible plastic display board that requires lightweight and flexible properties.

BRIEF SUMMARY OF THE INVENTION

It is an object of the present disclosure to provide a substrate for a display device or a flexible display device that realizes excellent heat resistance and high resistance characteristics without causing a film deformation even in high-temperature processes.

It is another object of the present disclosure to provide a display device or a flexible display device using the substrate for a display device or a flexible display device.

In order to achieve the above objects, according to one aspect of the present disclosure, there is provided a substrate for a display device or a flexible display device comprising: a first polyimide resin layer having a Td 1% of 570° C. or more and a yellowness index of 25 or more and 60 or less; a second polyimide resin layer having a yellowness index of less than 25; a first inorganic material layer positioned between the first polyimide resin layer and the second polyimide resin layer and having a thickness of 100 nm or more and 700 nm or less; and a second inorganic material layer formed on the second polyimide resin layer and having a thickness of 100 nm or more and 500 nm or less, wherein the yellowness index of each of the first polyimide resin layer and the second polyimide resin layer is measured based on a thickness of 10±1 μm.

According to another aspect, there is provided a display device or a flexible display device comprising the substrate for a display device or a flexible display device.

DETAILED DESCRIPTION OF THE INVENTION

Hereinbelow, a substrate for a display device or a flexible display device, and a display device or a flexible display device according to specific embodiments of the present disclosure will be described in more detail.

Unless otherwise specified throughout this specification, the technical terms used herein are only for reference to specific embodiments and is not intended to limit the present disclosure.

The singular forms "a", "an", and "the" used herein include plural references unless the context clearly dictates otherwise.

The term "including" or "comprising" as used herein specifies a specific feature, region, integer, step, action, element and/or component, but does not exclude the presence or addition of a different specific feature, region, integer, step, action, element, component and/or group.

The terms including ordinal numbers such as "a first", "a second", etc. are used only for the purpose of distinguishing one component from another component, and are not limited by the ordinal numbers. For instance, a first component may be referred to as a second component, or similarly, the second component may be referred to as the first component, without departing from the scope of the present disclosure.

In the present disclosure, the (co)polymer means including both a polymer and a copolymer, the polymer means a homopolymer consisting of a single repeating unit, and the copolymer means a composite polymer containing two or more repeating units.

In the present disclosure, examples of the substituents are described below, but are not limited thereto.

In the present disclosure, the term "substituted" means that other functional groups instead of a hydrogen atom in the compound are bonded, and a position to be substituted is not limited as long as the position is a position at which the hydrogen atom is substituted, that is, a position at which the substituent can be substituted, and when two or more are substituted, the two or more substituents may be the same as or different from each other.

In the present disclosure, the term "substituted or unsubstituted" means being unsubstituted or substituted with one or more substituents selected from the group consisting of deuterium; a halogen group; a cyano group; a nitro group; a hydroxyl group; a carbonyl group; an ester group; an imide group; an amide group; a primary amino group; a carboxy group; a sulfonic acid group; a sulfonamide group; a phosphine oxide group; an alkoxy group; an aryloxy group; an alkylthioxy group; an arylthioxy group; an alkylsulfoxy group; an arylsulfoxy group; a silyl group; a boron group; an alkyl group; a cycloalkyl group; an alkenyl group; an aryl group; an aralkyl group; an aralkenyl group; an alkylaryl group; an alkoxysilylalkyl group; an arylphosphine group; or a heterocyclic group containing at least one of N, O, and S atoms, or being unsubstituted or substituted with a substituent to which two or more substituents are linked among the substituents exemplified above. For example, "the substituent to which two or more substituents are linked" may be a biphenyl group. That is, the biphenyl group may also be an aryl group, and may be interpreted as a substituent to which two phenyl groups are linked.

In the present disclosure, the notation

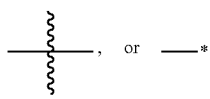

means a bond linked to another substituent group, and a direct bond means the case where no other atoms exist in the parts represented as L.

In the present disclosure, an aromatic is a property that satisfies Huckle's Rule, and a compound can be defined as aromatic if all of the following three conditions are satisfied according to Huckle's Rule.

1) There must be 4n+2 electrons that are completely conjugated by empty p-orbitals, unsaturated bonds, lone electron pairs, etc.
2) 4n+2 electrons have to form planar isomers and form a ring structure.
3) All atoms of the ring have to be able to participate in conjugation.

In the present disclosure, the alkyl group is a monovalent functional group derived from an alkane, and may be a straight-chain or a branched-chain. The number of carbon atoms of the straight chain alkyl group is not particularly limited, but is preferably 1 to 20. Also, the number of carbon atoms of the branched chain alkyl group is 3 to 20. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl, 2,6-dimethylheptane-4-yl and the like, but are not limited thereto. The alkyl group may be substituted or unsubstituted, and when substituted, examples of the substituent are the same as described above.

In the present disclosure, the haloalkyl group means a functional group in which the above-mentioned alkyl group is substituted by a halogen group, and examples of the halogen group are fluorine, chlorine, bromine or iodine. The haloalkyl group may be substituted or unsubstituted, and when substituted, examples of the substituent are the same as described above.

In the present disclosure, a multivalent functional group is a residue in which a plurality of hydrogen atoms bonded to an arbitrary compound are removed, and for example, it may be a divalent functional group, a trivalent functional group, and a tetravalent functional group. As an example, a tetravalent functional group derived from a cyclobutane means a residue in which any four hydrogen atoms bonded to the cyclobutane are removed.

In the present disclosure, the electron-withdrawing group may include one or more selected from the group consisting of a haloalkyl group, a halogen group, a cyano group, a nitro group, a sulfonic acid group, a carbonyl group, and a sulfonyl group, and preferably, it may be a haloalkyl group such as trifluororumethyl group (—$CF_3$).

In the present specification, a direct bond or a single bond means being connected to a bond line in which no atoms or atomic groups exist at the corresponding position. Specifically, it means the case where no other atoms exist in the parts represented as $L_1$, or $L_2$ in Chemical Formula.

Now, the present disclosure will be described in more detail.

According to one embodiment of the present disclosure, there can be provided a substrate for a display device or a flexible display device comprising: a first polyimide resin layer having a Td 1% of 570° C. or more and a yellowness index of 25 or more and 60 or less; a second polyimide resin layer having a yellowness index of less than 25; a first inorganic material layer positioned between the first polyimide resin layer and the second polyimide resin layer and having a thickness of 100 nm or more and 700 nm or less; and a second inorganic material layer formed on the second polyimide resin layer and having a thickness of 100 nm or more and 500 nm or less.

The present inventors have newly developed a substrate for a display device or a flexible display device in which a first inorganic material layer having a predetermined thickness is positioned between a colored polyimide resin layer having excellent heat resistance properties and a transparent polyimide resin layer having excellent high resistance properties, and a second inorganic material layer to be laminated is positioned on the transparent polyimide resin layer, and confirmed through experiments that even after such a substrate for a display device or a substrate for a flexible display device has gone through a high temperature process of 430° C. or more, the optical characteristics such as yellowness index or transmittance do not change significantly, the deformation of the morphology of the individual layer or the morphology of the stacked structure is not large, and the changes in the physical properties are also not large, thereby completing the present disclosure.

In particular, the substrate for a display device or a flexible display device according to the one embodiment has a structure in which a first inorganic material layer having a predetermined thickness is interposed between the first polyimide resin layer and the second polyimide resin layer having the above-mentioned characteristics, whereby even in a process of applying a high temperature of 400° C. or more, particularly in the manufacturing process of a display device or a flexible display device, the deterioration of optical characteristics or the deformation of the morphology is not large, and further the surface resistance is high, which can prevent afterimages and malfunctions of a panel unit from occurring on the display panel, thereby capable of providing a high-quality substrate for a display device or a flexible display device.

Specifically, as the substrate for a display device or a flexible display device includes a first polyimide resin layer having a Td 1% of 570° C. or more and a yellowness index of 25 or more and 60 or less, the mechanical properties, dimensional stability and excellent heat resistance at high temperatures can be secured due to the high packing density of the first polyimide resin, and therefore, the deformation and denaturation of the resin layer can be significantly reduced even after passing a high-temperature process of 430° C. or more.

In particular, the first polyimide resin layer having mechanical properties and excellent heat resistance at high temperature is subjected to more thermal history, and even if the substrate for a display device or a substrate for a flexible display device according to the one embodiment having the stacked structure goes through a high temperature process of 430° C. or more, the deformation and denaturation of the substrate for a display device or a substrate for a flexible display device can be significantly reduced.

When the Td % of the first polyimide resin layer included in the substrate for a display device or a substrate for a flexible display device is less than 570° C., the heat resistance and mechanical properties of the substrate for a display device or a flexible display device are significantly inferior, and thus the deformation and degeneration of the film at a high temperature may exhibit severely.

In addition, by including a second polyimide resin layer having a yellowness index of less than 25, due to the wide polymer chain spacing of the second polyimide resin layer, high resistance characteristics are realized, and the electrical influence is reduced, which can be useful for improving afterimage when applied to a display device or a flexible display device.

When the second polyimide resin layer included in the substrate for a display device or a flexible display device has a high yellowness index, the transmittance of the substrate for the display device or the flexible display device may be decreased or the yellowness index may be increased, and the high resistance characteristic may be deteriorated.

Specifically, the first polyimide resin layer having a Td 1% of 570° C. or more and a yellowness index of 25 or more and 60 or less is excellent in terms of the morphological stability at high temperature, and the second polyimide resin layer having a yellowness index of less than 25 can be excellent in high resistance characteristics.

More specifically, the substrate for a display device or a flexible display device includes a first polyimide resin layer that is first laminated in the manufacturing process and further passes through a heat treatment process, with the first polyimide resin layer having a yellowness index of 25 or more and 60 or less which is excellent in morphological stability, and a second polyimide resin layer which is a layer closer to a thin film transistor that receives a greater electrical influence as it is closer to the thin film transistor, with the second polyimide resin layer having a yellowness index of less than 25 which is excellent in high resistance characteristics, whereby the substrate for a display device or a flexible display device according to the one embodiment can realize excellent morphological stability and, at the same time, realize excellent high resistance characteristics.

On the other hand, the substrate for a display device or a flexible display device of the one embodiment may include a first inorganic material layer positioned between the first polyimide resin layer and the second polyimide resin layer and having a thickness of 100 nm or more and 700 nm or less, 200 nm or more and 600 nm or less, or 300 nm or more and 500 nm or less.

The first inorganic material layer is positioned between the first polyimide resin layer and the second polyimide resin layer, and blocks air and moisture, thereby capable of realizing excellent device stability. Further, by minimizing the electrical influence of the thin film transistor, it is possible to provide a high-quality substrate for a display device or a flexible display device.

When the first inorganic layer is not included or the thickness thereof is less than 100 nm, air and moisture are not blocked and thus the device stability may be reduced. Further, an electrical influence on the thin film transistor becomes large, and thus the quality of the substrate for a display device or a flexible display device may deteriorate.

Further, when the thickness of the first inorganic material layer exceeds 700 nm, not only the first inorganic material layer becomes too thick, making it vulnerable to external changes and stress, but also the productivity is lowered due to an increase in process cost and vapor deposition time, which may be unsuitable for use as a substrate for a display device or a flexible display device.

The inorganic material layer includes at least one inorganic material selected from the group consisting of silicon oxide (SiOx), silicon nitride (SiNx), silicon oxynitride (SiON), aluminum oxide (AlO), and aluminum oxynitride (AlON).

A conventional inorganic material forming method in the technical field to which the present disclosure pertains, such as a chemical vapor deposition method (CVD), can be applied to the formation of the first inorganic material layer.

In the substrate for a display device or a flexible display device of the one embodiment, the first polyimide resin layer may have a Td 1% of 570° C. or more, 570° C. or more and 650° C. or less, or 570° C. or more and 600° C. or less.

The Td 1% may mean a temperature (° C.) when the weight reduction rate is 1% based on the mass of a sample at 100° C. The method of measuring the Td 1% is not particularly limited, but can be measured using a TGA equipment as an example. More specifically, it can be measured using the Discovery TGA equipment (TA Instruments).

In the substrate for a display device or a flexible display device of the one embodiment, as the Td 1% of the first polyimide resin layer is 570° C. or more, excellent heat resistance is exhibited, and mechanical properties and dimensional stability can be secured without being deformed even at high temperatures. Specifically, even when going through a high temperature process of 430° C. or more during the manufacture of a flexible display, deformation and denaturation of the resin layer may be significantly reduced.

In addition, in the substrate for a display device or a flexible display device of the one embodiment, the first polyimide resin layer may have a yellowness index of 25 or more and 60 or less, 25 or more and 50 or less, or 25 or more and 30 or less.

The yellowness index of the first polyimide resin layer was measured with respect to a sample of the first polyimide resin layer having a thickness of 10±1 μm, the method of measuring the yellowness index is not particularly limited, and the yellowness index can be measured, for example, using a color meter. More specifically, it can be measured using GretagMacbeth's Color-Eye 7000A.

Specifically, the yellowness index of the first polyimide resin layer may be a value obtained by coating a composition for forming the first polyimide resin layer onto a glass substrate of 10 cm×10 cm and then measuring with respect to the central portion of the coated first polyimide resin layer thin film having a thickness of 10±1 μm.

As described above, in the substrate for a display device or a flexible display device, as the first polyimide resin layer laminated on the substrate has a yellowness index of 25 or more and 60 or less, the mechanical properties, dimensional stability and excellent heat resistance at high temperature can be secured due to the high packing density, and thereby, the deformation and denaturation of the resin layer may be significantly reduced even after going through a high temperature process of 430° C. or more.

On the other hand, in the substrate for a display device or a flexible display device of the one embodiment, the second polyimide resin layer may have a yellowness index of less than 25, 20 or less, 1 or more and 20 or less, 5 or more and 20 or less, or 5 or more and 15 or less.

The yellowness index of the second polyimide resin layer was measured with respect to a second polyimide resin layer sample having a thickness of 10±1 μm. The method of measuring the yellowness index is not particularly limited, and can be measured, for example, using a color meter. More specifically, it can be measured using GretagMacbeth's Color-Eye 7000A.

Specifically, the yellowness index of the second polyimide resin layer may be a value obtained by coating a composition for forming the first polyimide resin layer onto a glass substrate of 10 cm×10 cm to form a first polyimide resin layer, forming a first inorganic material layer on the first polyimide resin layer by a plasma chemical vapor deposition method, forming a second polyimide resin layer on the first inorganic material layer, and measuring with respect to the central portion of the second polyimide resin layer thin film.

As the second polyimide resin layer has a yellowness index of less than 25, excellent low-dielectric characteristics and high-resistance characteristics are realized due to the wide polymer chain spacing of the second polyimide resin layer, and therefore, the electrical influence is reduced, which can be useful for improving afterimages when applied to a display device or a flexible display device.

On the other hand, in the substrate for a display device or a flexible display device of the one embodiment, the difference between the yellowness index of the first polyimide resin layer and the yellowness index of the second polyimide resin layer may be 5 or more, 5 or more and 50 or less, 5 or more and 30 or less, 5 or more and 15 or less, or 5 or more and 10 or less.

On the other hand, the substrate for a display device or a flexible display device of the one embodiment may further include a second inorganic material layer formed on the second polyimide resin layer and having a thickness of 100 nm or more and 500 nm or less, or 200 nm or more and 400 nm or less.

That is, the substrate for a display device or a substrate for a flexible display device according to the one embodiment may have a structure in which a first polyimide resin layer having a Td 1% of 570° C. or more and a yellowness index of 25 or more and 60 or less is laminated on a substrate, a first inorganic material layer having a thickness of 100 nm or more and 700 nm or less is laminated on the first polyimide resin layer, a second polyimide resin layer having a yellowness index of less than 25 is laminated on the first inorganic layer, and a second inorganic material layer having a thickness of 100 nm or more and 500 nm or less, or 200 nm or more and 400 nm or less is laminated on the second polyimide resin layer having a yellowness index of 20 or less.

The second inorganic material layer is located on the second polyimide resin layer, and can secondarily block air and moisture, thereby realizing excellent device stability, and further by minimizing the electrical influence of the thin film transistor, it is possible to provide a high-quality substrate for a display device or a flexible display device.

When the second inorganic layer is not included or the thickness thereof is less than 100 nm, air and moisture are not blocked, and thus the device stability may be deteriorated, and further the electrical influence on the thin film transistor is increased, which may cause deterioration of the quality of the substrate for the display device or the flexible display device.

Moreover, when the thickness of the second inorganic material layer exceeds 500 nm, not only the thickness of the second inorganic layer becomes too thick, making it vulnerable to external changes and stresses, but also but also the productivity is lowered due to an increase in process cost and deposition time, which may be unsuitable for use as a substrate for a display device or a flexible display device.

The inorganic material layer may include at least one inorganic material selected from the group consisting of silicon oxide (SiOx), silicon nitride (SiNx), silicon oxynitride (SiON), aluminum oxide (AlO), and aluminum oxynitride (AlON).

A conventional inorganic material forming method in the technical field to which the present disclosure pertains, such as a chemical vapor deposition method (CVD), can be applied to the formation of the second inorganic material layer.

On the other hand, in the substrate for a display device or a flexible display device of the one embodiment, the yellowness index of the whole substrate for the display device or the flexible display device may be 36 or less, 10 to 36, 20 to 36, 24 to 36, or 24 to 30.

As described above, by including a first polyimide resin layer having a yellowness index of 25 or more and 60 or less and a second polyimide resin layer having a yellowness index of 20 or less, the yellowness index of the whole substrate for the display device or the flexible display device can satisfy 36 or less.

When the yellowness index of the whole substrate for the display device or the flexible display device is high, it may not be suitable for use as a substrate for a transparent display for high transmission. Further, when the yellowness index of the whole substrate for the display device or the flexible display device is high, the dielectric constant may appear high due to problems resulting from the internal lamination structure, particularly the dielectric constant appears to be excessively high and the afterimage characteristic is deteriorated, which may be unsuitable for use as a substrate for a display device or a flexible display device.

The method of measuring the yellowness index is not particularly limited, and the yellowness index can be measured, for example, using a color meter. More specifically, it can be measured using GretagMacbeth's Color-Eye 7000A.

The yellowness index can be measured from a substrate sample for a display device or a flexible display device having a thickness of 16±1 μm. When the thickness of the sample increases or decreases by a specific value, the measured physical properties may also change by a certain value.

Specifically, the yellowness index of the whole substrate for a display device or a flexible display device may be a value obtained by coating a composition for forming the first polyimide resin layer onto a glass substrate of 10 cm×10 cm to form a first polyimide resin layer, forming a first inorganic material layer on the first polyimide resin layer by a plasma chemical vapor deposition method, forming a second polyimide resin layer on the first inorganic material layer, forming a second inorganic material layer on the second polyimide resin layer by a plasma chemical vapor deposition method, and measuring with respect to the central portion of the second inorganic material layer thin film.

On the other hand, in the substrate for a display device or a flexible display device of the one embodiment, with respect to the whole substrate for the display device or the flexible display device, the yellowness index after heat treatment steps of raising a temperature up to 430° C. for 2 hours, going through an isothermal process at 430° C. for 2 hours, and then cooling to 50° C. for 2 hours may be 50 or less, 25 or more and 50 or less, 30 or more and 50 or less, 33 or more and 50 or less, or 33 or more and 40 or less.

The method of measuring the yellowness index is not particularly limited and can be measured, for example, using a color meter. More specifically, it can be measured using GretagMacbeth's Color-Eye 7000A.

The yellowness index can be measured from a substrate sample for a display device or a flexible display device having a thickness of 16±1 μm. When the thickness of the sample increases or decreases by a specific value, the measured physical properties may also change by a certain value.

As the yellowness index of the whole substrate for a display device or a flexible display device is 50 or less even after a heat treatment step of raising a temperature up to 430° C. for 2 hours, going through an isothermal process at 430° C. for 2 hours, and then cooling to 50° C. for 2 hours, it is possible to secure optical characteristics such as adequate transmittance and yellowness index, which can be suitable for use in a display device or a flexible display device.

On the other hand, in the one embodiment, based on the initial yellowness index of the whole substrate for the display device or the flexible display device, a percentage of the yellowness index after heat treatment steps of raising a temperature up to 430° C. for 2 hours, going through an isothermal process at 430° C. for 2 hours, and then cooling to 50° C. for 2 hours may be 130% or less, or 100% or more and 130% or less, or 110% or more and 130% or less.

Based on the initial yellowness index of the whole substrate for the display device or the flexible display device of the one embodiment, as a percentage of the yellowness index after heat treatment steps of raising a temperature up to 430° C. for 2 hours, going through an isothermal process at 430° C. for 2 hours, and then cooling to 50° C. for 2 hours is 130% or less, a substrate for a display device or a flexible display device having excellent optical characteristics can be provided even after going through a high-temperature process of 430° C. or more. Based on the initial yellowness index of the whole substrate for the display device or the flexible display device of the one embodiment, the percentage of the yellowness index after heat treatment steps of raising a temperature up to 430° C. for 2 hours, going through an isothermal process at 430° C. for 2 hours, and then cooling to 50° C. for 2 hours can be realized as the substrate for a display device or a flexible display device of the embodiment includes a first polyimide resin layer having a Td 1% of 570° C. or more and a yellowness index of 25 or more and 60 or less, and a second polyimide resin layer having a yellowness index of less than 25 as described above.

On the other hand, the thickness of each of the first polyimide resin layer and the second polyimide resin layer can be determined in consideration of the thickness or physical properties of each or the whole of the first inorganic material layer, the second inorganic material layer, and the substrate for the display device or the flexible display device. For example, each of the first polyimide resin layer and the second polyimide resin layer may have a thickness of 0.5 μm to 20 μm.

At this time, the yellowness index of the first polyimide resin layer and the second polyimide resin layer may vary depending on the thickness, but as described above, the yellowness index of each of the first polyimide resin layer and the second polyimide resin layer is measured and defined based on a thickness of 10±1 μm.

More specifically, the first polyimide resin layer may have a thickness of 1 μm to 10 μm, 2 μm to 10 μm, or 6 μm to 10 μm, and the second polyimide resin layer may have a thickness of 0.5 μm to 6 μm, 1 μm to 6 μm, or 3 μm to 6 μm.

Alternatively, the first polyimide resin layer may have a thickness of 1 μm to 6 μm, 1 μm to 5 μm, or 2 μm to 5 μm, and the second polyimide resin layer may have a thickness of 6 μm to 15 μm, 8 μm to 15 μm, or 10 μm to 15 μm.

On the other hand, the Td 1% of the second polyimide resin layer may be 500° C. or more and 560° C. or less, 500° C. or more and 555° C. or less, or 520° C. or more and 555° C. or less, or 545° C. or more and 555° C. or less.

The Td 1% may mean a temperature (° C.) when the weight reduction rate is 1% based on the mass of a sample at 100° C. as described above. The method of measuring the Td 1% is not particularly limited, but can be measured using a TGA equipment as an example. More specifically, it can be measured using the Discovery TGA equipment (TA Instruments).

In the substrate for a display device or a flexible display device of the one embodiment, as the Td 1% of the second polyimide resin layer is 500° C. or more and 560° C. or less, it is possible to realize the high resistance and excellent optical characteristics of the second polyimide resin layer as well as the high heat resistance characteristics of the first polyimide resin layer having a Td 1% of 570° C. or more and more excellent heat resistance.

Specifically, the first polyimide resin layer and the second polyimide resin layer each have a transmittance of 50% or more, 50% or more and 100% or less, 65% or more and 95% or less at a wavelength of 470 nm, and can exhibit a haze of 1.0% or less, 0.1% or more and 1.0% or less, and 0.3% or more and 0.8% or less.

Examples of the method and system for measuring the haze according to the one embodiment are not particularly limited, and various methods conventionally used for haze measurement can be applied without limitation. In one example, the haze can be measured according to the measurement method of ASTM D1003 using a HAZE METER (model name: NDH7000, Nippon Denshoku).

Examples of the method and system for measuring the transmittance according to the one embodiment are not particularly limited, and various methods conventionally used for transmittance measurement can be applied without limitation. In one example, the transmittance (T) for light with a wavelength of 470 nm can be measured using a UV-vis spectrometer (Agillent, UV 8453).

Further, the transmittance and haze may be values measured with respect to the samples of the first polyimide resin layer and the second polyimide resin layer having a thickness of 10 μm. When the thickness of the resin layer increases or decreases by a specific value, the transmittance and haze may also change by a certain value.

As the first polyimide resin layer and the second polyimide resin layer each have a transmittance of 50% or more at a wavelength of 470 nm and exhibit a haze of 1.0% or less, it is possible to provide a substrate for a display device or a flexible display device suitable for use in a device for a display device or a device for a flexible display device by securing suitable optical characteristics such as transmittance and yellowness index.

The polyimide polymer is meant to include both a polyimide, and a precursor polymer thereof such as polyamic acid ester or polyamic acid ester. That is, the polyimide polymer may include at least one selected from the group consisting of a polyamic acid repeating unit, a polyamic acid ester repeating unit, and a polyimide repeating unit. That is, the polyimide-based polymer may include one type of polyamic acid repeating unit, one type of polyamic acid ester repeating unit, one type of polyimide repeating unit, or a copolymer in which these two or more types of repeating units are mixed.

The one or more repeating units selected from the group consisting of the polyamic acid repeating unit, the polyamic acid ester repeating unit, and the polyimide repeating unit can form a main chain of the polyimide polymer.

Specifically, the second polyimide resin layer may include a polyimide resin containing a repeating unit derived from diamine substituted with a fluorine-based functional group.

More specifically, the second polyimide resin layer may include a reaction product between an aromatic tetracarboxylic acid or an anhydride thereof and a diamine substituted with a fluorine-based functional group, or a polyimide resin containing a repeating unit derived therefrom.

As the second polyimide resin layer includes a reaction product between an aromatic tetracarboxylic acid or an anhydride thereof and a diamine substituted with a fluorine-based functional group, or a polyimide resin containing a repeating unit derived therefrom, the second polyimide resin layer can realize a yellowness index of less than 25.

More specifically, the second polyimide resin layer may include a polyimide resin containing a repeating unit represented by the following Chemical Formula 1.

[Chemical Formula 1]

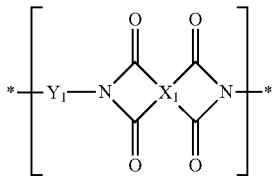

wherein, in Chemical Formula 1,
$X_1$ is an aromatic tetravalent functional group, and
$Y_1$ is an aromatic divalent functional group in which at least one fluorine-based functional group is substituted.

In Chemical Formula 1, $X_1$ is a functional group derived from a tetracarboxylic dianhydride compound used in the synthesis of a polyimide-based resin.

In Chemical Formula 1, $Y_1$ is an aromatic divalent functional group in which at least one fluorine-based functional group is substituted, and may be a functional group derived from a diamine compound used in the synthesis of a polyimide-based resin.

As the fluorine-based functional group such as trifluorumethyl group ($-CF_3$) having high electronegativity are substituted, the effect of suppressing the formation of CTC (charge transfer complex) of Pi-electrons existing in the polyimide polymer chain is increased, thereby ensuring improved transparency. That is, the packing in the polyimide structure or between the chains can be reduced, and due to steric hindrance and electrical effects, it is possible to weaken the electrical interaction between the chromophores and show high transparency in the visible region.

Specifically, the divalent organic group of the $Y_1$ in which at least one fluorine-based functional group is substituted may include a functional group represented by the following Chemical Formula 3-1.

[Chemical Formula 3-1]

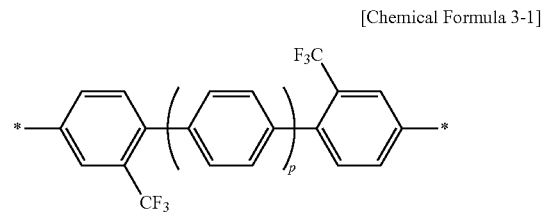

wherein, in Chemical Formula 3-1,
P is an integer of 0 or more and 5 or less, preferably an integer of 0 or more and 2 or less.

More specifically, the polyimide-based resin has a feature that a terminal anhydride group ($-OC-O-CO$) of the tetracarboxylic dianhydride can be reacted with a terminal amino group ($-NH_2$) of the aromatic diamine in which at least one fluorine-based functional group is substituted, thereby forming a bond between the nitrogen atom of the amino group and the carbon atom of the anhydride group.

The second polyimide resin layer can be prepared by reacting two or more types of different diamine compounds with a tetracarboxylic dianhydride compound, and the two types of diamine compounds can be added simultaneously to synthesize a random copolymer, or can be added sequentially to synthesize a block copolymer.

Specifically, the second polyimide resin layer may include a polyimide resin further containing a repeating unit represented by the following Chemical Formula 1-1 in addition to the repeating unit represented by Chemical Formula 1.

[Chemical Formula 1-1]

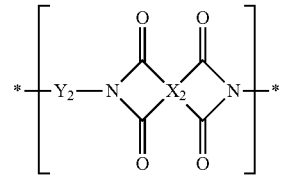

wherein, in Chemical Formula 1-1, $X_2$ is an aromatic tetravalent functional group, and $Y_2$ is an aromatic divalent functional group different from that of $Y_1$ of Chemical Formula 1.

On the other hand, the first polyimide resin layer may include a polyimide resin containing a repeating unit derived from a diamine unsubstituted with a fluorine-based functional group.

Specifically, the first polyimide resin layer may include a reaction product between tetracarboxylic acid or an anhydride thereof and a diamine unsubstituted with a fluorine-based functional group, or a polyimide resin containing a repeating unit derived therefrom.

As the first polyimide resin layer includes a reaction product between tetracarboxylic acid or an anhydride thereof and a diamine unsubstituted with a fluorine-based functional group, or a polyimide resin containing a repeating unit derived therefrom, the first polyimide resin layer can p realize a Td 1% of 570° C. or more, and a yellowness index of 25 or more and 60 or less.

More specifically, the first polyimide resin layer may include a polyimide resin containing a repeating unit represented by the following Chemical Formula 4.

[Chemical Formula 4]

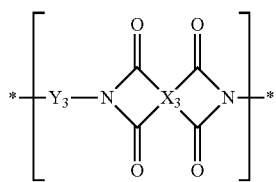

wherein, in Chemical Formula 4, $X_3$ is a tetravalent functional group represented by the following Chemical Formula 5, and $Y_3$ is an aromatic divalent functional group unsubstituted with a fluorine-based functional group.

[Chemical Formula 5]

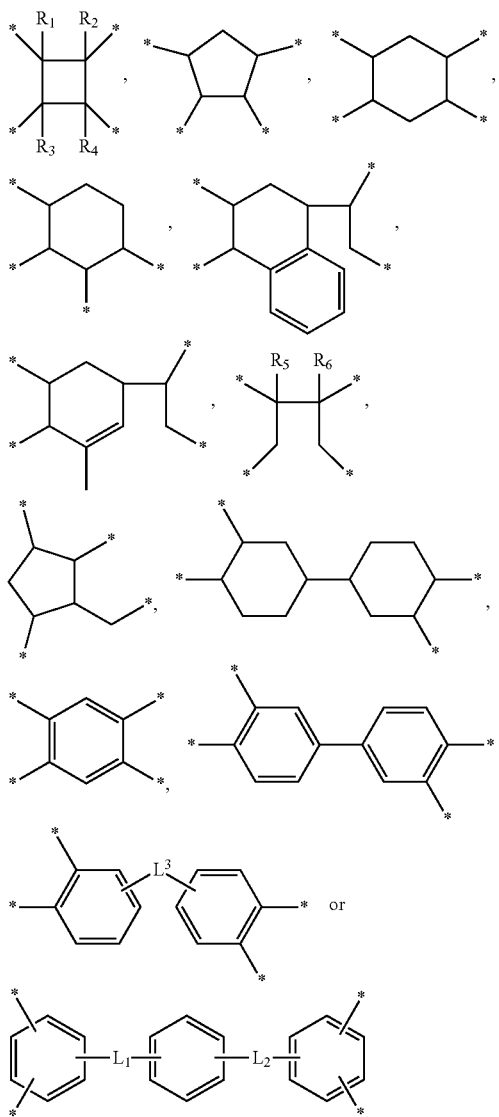

wherein, in Chemical Formula 5, $R_1$ to $R_6$ are each independently hydrogen or an alkyl group having 1 to 6 carbon atoms, $L_1$ and $L_2$ are the same as or different from each other, and each independently represent any one selected from the group consisting of a single bond, —O—, —CO—, —COO—, —S—, —SO—, —SO$_2$—, —CR$_7$R$_8$—, —(CH$_2$)$_t$—, —O(CH$_2$)$_t$O—, —COO(CH$_2$)$_t$OCO—, —CONH—, phenylene or a combination thereof, where $R_7$ and $R_8$ are each independently one of hydrogen, an alkyl group having 1 to 10 carbon atoms, or a haloalkyl group having 1 to 10 carbon atoms, and t is an integer of 1 to 10.

Specific examples of the functional group represented by Chemical Formula 5 may include a functional group represented by the following Chemical Formula 8-1.

[Chemical Formula 8-1]

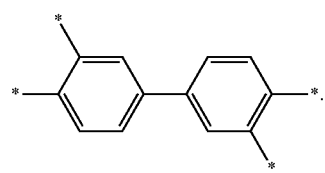

In Chemical Formula 4, $X_3$ is a functional group derived from a tetracarboxylic dianhydride compound used in the synthesis of a polyimide-based resin.

In Chemical Formula 4, $Y_3$ is an aromatic divalent functional group unsubstituted with a fluorine-based functional group, and may be a functional group derived from a diamine compound used in the synthesis of a polyimide-based resin.

Specifically, the aromatic divalent functional group of the $Y_3$ in which a fluorine-based functional group is unsubstituted may include a functional group represented by the following Chemical Formula 9-1.

[Chemical Formula 9-1]

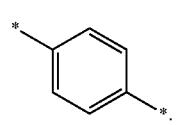

On the other hand, in the substrate for a display device or a flexible display device, each of the first polyimide resin layer and the second polyimide resin layer may have a coefficient of thermal expansion of 5 ppm/° C. or less in the section of 100° C. or more and 460° C. or less.

The coefficient of thermal expansion is determined by measuring the change in the thermal expansion of a polyimide resin layer sample using TMA Q400 (TA Instruments) at the time when a force pulling the sample is set to 0.01N or more and 0.1N or less, or 0.01N or more and 0.05N or less, a primary temperature-rising step is performed at a heating rate of 1° C./min or more and 10° C./min or less, or 4° C./min or more and 6° C./min or less in a temperature range of 100° C. or more and 460° C. or less, and then the sample is cooled at cooling rate of 1° C./min or more and 10° C./min or less, or 3° C./min or more and 5° C./min or less in the temperature range of 50° C. to 100° C.

The coefficient of thermal expansion may be measured from a polyimide resin layer sample having a thickness of 10±1 μm. When the thickness of the polyimide resin layer increases or decreases by a specific value, the physical properties measured from the polyimide resin layer may also change by a certain value.

In the substrate for the display device or the flexible display device, as the first polyimide resin layer and the second polyimide resin layer satisfy the coefficient of thermal expansion of 5 ppm/° C. or less in the section of 100° C. or more and 460° C. or less, sufficient heat resistance is ensured even in the substrate for display devices or flexible display devices obtained by high-temperature curing. When this is as a plastic substrate, it can prevent the plastic substrate from being damaged by heat when heat-treating the metal layer formed on the plastic substrate, and it can also suppress the occurrence of warpage in the metal thin film formed on the plastic substrate.

The weight average molecular weight (measured by GPC) of the polyimide resin is not particularly limited, but for example, it may be 1000 g/mol or more and 200000 g/mol or less, or 10000 g/mol or more and 200000 g/mol or less.

The substrate for a display device or a flexible display device according to the present disclosure can exhibit excellent colorless and transparent characteristics while maintaining the characteristics such as heat resistance and mechanical strength due to a rigid structure as they are, and thus can be used in various fields such as a substrate for device, a cover substrate for display, an optical film, IC (integrated circuit) package, an adhesive film, a multi-layer flexible printed circuit (FRC), a tape, a touch panel, a protective film for optical disk, and the like.

On the other hand, the substrate for a display device or a flexible display device of the one embodiment may include a cured product in which the polyimide-based resin is cured at a temperature of 400° C. or more. The cured product means a material obtained through a curing process of the resin composition containing the polyimide-based resin, and the curing process may be performed at a temperature of 400° C. or more, or 400° C. or more and 500° C. or less.

More specifically, examples of the method of synthesizing the polyimide resin layer of the substrate for the display device or the flexible display device is not particularly limited, and for example, a preparation method including a step of coating a resin composition containing the polyimide-based resin onto a substrate to form a coating film (step 1); a step of drying the coating film (step 2); and a step of heat-treating and curing the dried coating film (step 3) can be used.

Step 1 is a step of coating the resin composition containing the above-mentioned polyimide-based resin onto a substrate to form a coating film. The method of coating the resin composition containing the polyimide-based resin onto a substrate is not particularly limited, and for example, a method such as screen printing, offset printing, flexographic printing, inkjet, and the like can be used.

Further, the resin composition containing the polyimide-based resin may be in the form that is dissolved or dispersed in an organic solvent. In the case of having such form, for example, when the polyimide-based resin is synthesized in the organic solvent, the solution may be the reaction solution thus obtained itself or may be a solution obtained by diluting the reaction solution with another solvent. Further, when the polyimide is obtained as powder, the solution may be a solution obtained by dissolving the powder in an organic solvent.

Specific examples of the organic solvent include toluene, N,N-dimethylformamide, N,N-dimethylacetamide, N-methyl-2-pyrrolidone, N-methylcaprolactam, 2-pyrrolidone, M-ethylpyrrolidone, N-vinylpyrrolidone, dimethyl- sulfoxide, tetramethylurea, pyridine, dimethyl sulfone, hexamethyl sulfoxide, γ-butyrolactone, 3-methoxy-N,N-dimethylpropanamide, 3-ethoxy-N,N-dimethylpropanamide, 3-butoxy-N,N-dimethylpropanamide, 1,3-dimethyl-imidazolidinone, ethyl amyl ketone, methyl nonyl ketone, methyl ethyl ketone, methyl isoamyl ketone, methyl isopropyl ketone, cyclohexanone, ethylene carbonate, propylene carbonate, diglyme, 4-hydroxy-4-methyl-2-pentanone, ethylene glycol monomethyl ether, ethylene glycol monomethyl ether acetate, ethylene glycol monoethyl ether, ethylene glycol monoethyl ether acetate, ethylene glycol monopropyl ether, ethylene glycol monopropyl ether acetate, ethylene glycol monoisopropyl ether, ethylene glycol monoisopropyl ether acetate, ethylene glycol monobutyl ether, ethylene glycol monobutyl ether acetate and the like. They can be used alone or in combination of two or more.

The resin composition containing the polyimide-based polymer may include the solid in such an amount that the solution has an appropriate viscosity in consideration of processability such as a coating property during the film forming process. For example, the content of the composition may be adjusted so that the total content of the resin is 5% by weight or more and 25% by weight or less, or may be adjusted to 5% by weight or more and 20% by weight or less.

In addition, the resin composition containing the polyimide-based resin may further include other components in addition to the organic solvent. In a non-limiting example, when the resin composition containing the polyimide polymer is coated, additives capable of improving the uniformity of the film thickness and the surface smoothness, or improving the adhesion with a substrate, or changing the dielectric constant and conductivity, or increasing the denseness, may be further included. Examples of these additives include surfactants, silane-based compounds, dielectrics or crosslinking compounds, and the like.

Step 2 is a step of drying the coating film formed by coating a resin composition containing the polyimide-based resin onto a substrate.

The step of drying the coating film may be performed by a heating means such as a hot plate, a hot-air circulation furnace, an infrared furnace and the like, and the drying may be performed at a temperature of 50° C. or more and 150° C. or less, or 50° C. or more and 100° C. or less.

Step 3 is a step of heat-treating and curing the dried coating film. In this case, the heat treatment may be performed by a heating means such as a hot plate, a hot-air circulation furnace, an infrared furnace and the like, and the heat treatment can be performed at a temperature of 400° C. or more, or 400° C. or more and 500° C. or less.

The thickness of the substrate for a display device or a flexible display device is not particularly limited, but for example, it can be freely adjusted within the range of 0.01 μm or more and 1000 μm or less. If the thickness of the substrate for the display device or the flexible display device increases or decreases by a specific value, the physical properties measured from the substrate for the display device or the flexible display device can also change by a certain value.

The substrate for a display device or a flexible display device according to the embodiment may further include a silicon oxide layer formed between the polyimide resin layer and the cured layer in terms of being able to further improve the solvent resistance, water permeability and optical characteristics thereof, and the silicon oxide layer may be produced by curing polysilazane.

Specifically, the silicon oxide layer may, before the step of forming a coating layer on at least one surface of the polyimide resin layer, be formed by curing the coated polysilazane after coating and drying a solution containing polysilazane Meanwhile, according to another embodiment of the present disclosure, there can be provided a display device or a flexible display device including the substrate for a display device or a flexible display device according to the other embodiment. Details of the substrate for a display device or a flexible display device may include all of those described above in the one embodiment.

For the configuration and manufacturing method of the display device or the flexible display device, a technique known in the art can be used, except that the composite substrate for manufacturing the display device or the flexible display device is used for the above-mentioned applications.

The display device or the flexible display device can be used as a curved, bendable, flexible, rollable or foldable-shaped mobile communication terminal, a touch panel of a smartphone or a tablet PC, and cover substrate or element substrate of various displays.

An example of the display device or the flexible display device may be a flexible light emitting element display device.

For example, in the organic light emitting diode (OLED) display, a cover window of the display device may be positioned on an outer portion in a direction in which light or an image is emitted, and a cathode providing electrons, an electron transport layer, an emission layer, a hole transport layer, and an anode providing holes may be sequentially formed.

Further, the organic light emitting diode (OLED) display may further include a hole injection layer (HIL) and an electron injection layer (EIL).

In order to allow the organic light emitting diode (OLED) display to serve and act as a flexible display, a material having predetermined elasticity may be used in cathodes and anodes and each of the constituent components.

Another example of the display device or the flexible display device may be a rollable display or foldable display device.

The rollable display may have various structures according to an application field, a specific shape, and the like. For example, the rollable display device may have a structure including a cover plastic window, a touch panel, a polarizing plate, a barrier film, a light emitting element (OLED element, or the like), a transparent substrate, or the like.

Advantageous Effects

According to the present disclosure, a substrate for a display device or a flexible display device that achieves high resistance and low moisture absorption, has no film denaturation even in high-temperature heat treatment processes, and can achieve excellent optical characteristics, and a display device or a flexible display device using the same can be provided.

DETAILED DESCRIPTION OF THE EMBODIMENTS

The present disclosure will be described in more detail with reference to the following examples. However, these examples are presented for illustrative purposes only, and the scope of the invention is not limited thereby.

Preparation Example 1

200 g of N-methyl-2-pyrrolidone was filled into a 500 mL 4-neck round bottom flask (reactor) equipped with a stirrer, a nitrogen injection device, a dropping funnel, a temperature controller and a condenser while passing nitrogen slowly. Then, the temperature of the reactor was adjusted to 60° C., and 133 mmole of para-phenylene diamine (PDA) was added and completely dissolved.

While maintaining the temperature of the resulting solution at 60° C., 132 mmole of 3,3',4,4'-biphenyltetracarboxylic dianhydride (BPDA) was added to the reactor together with 120 g of N-methyl-2-pyrrolidone, and the mixture was stirred and diluted for 48 hours to obtain a polyimide precursor composition P-1 (solid content: 11 wt. %).

Preparation Example 2

100 g of diethylacetamide (DEAC) was filled into a 500 mL 4-neck round bottom flask (reactor) equipped with a stirrer, a nitrogen injection device, a dropping funnel, a temperature controller and a condenser while passing nitrogen slowly. Hereto, 33 mmole of p-phenylene diamine (PDA) and 33 mmole of 2,2'-bis(trifluoromethyl) benzidine (TFMB) were added and completely dissolved.

While maintaining the temperature of the resulting solution at room temperature, 51 mmole of 3,3',4,4'-biphenyltetracarboxylic dianhydride (BPDA) and 15 mmol of 9,9-bis (3,4-dicarboxyphenyl)fluorene dianhydride (BPAF) were added to the reactor together with 100 g of DEAC, and the mixture was stirred and diluted for 48 hours to obtain a polyimide precursor composition P-2 (solid content: 13 wt. %).

Preparation Example 3

100 g of diethylacetamide (DEAC) was filled into a 500 mL 4-neck round bottom flask (reactor) equipped with a stirrer, a nitrogen injection device, a dropping funnel, a temperature controller and a condenser while passing nitrogen slowly. Hereto, 35 mmole of the diamine represented by the following Chemical Formula A was added and completely dissolved.

[Chemical Formula A]

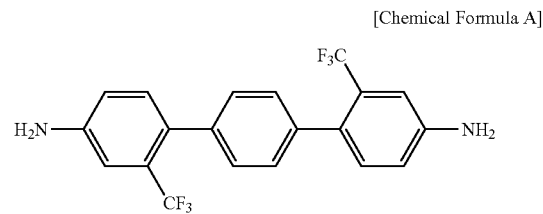 [SMILES: Nc1ccc(-c2ccc(-c3ccc(N)cc3C(F)(F)F)cc2)c(C(F)(F)F)c1]

While maintaining the temperature of the resulting solution at 40° C., 27 mmole of 3,3',4,4'-biphenyltetracarboxylic dianhydride (BPDA) and 8 mmol of 9,9-bis(3,4-dicarboxyphenyl)fluorene dianhydride (BPAF) were added to the reactor together with 60 g of DEAC, and the mixture was stirred and diluted for 48 hours to obtain a polyimide precursor composition P-3 (solid content: 10 wt. %).

Preparation Example 4

100 g of diethylacetamide (DEAC) was filled into a 500 mL 4-neck round bottom flask (reactor) equipped with a stirrer, a nitrogen injection device, a dropping funnel, a temperature controller and a condenser while passing nitrogen slowly. Hereto, 35 mmole of the diamine represented by the following Chemical Formula B was added and completely dissolved.

[Chemical Formula B]

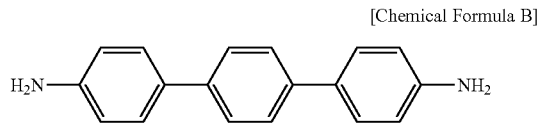 [SMILES: Nc1ccc(-c2ccc(-c3ccc(N)cc3)cc2)cc1]

While maintaining the temperature of the resulting solution at 40° C., 27 mmole of 3,3',4,4'-biphenyltetracarboxylic dianhydride (BPDA) and 8 mmol of 9,9-bis(3,4-dicarboxyphenyl)fluorene dianhydride (BPAF) were added to the reactor together with 60 g of DEAC, and the mixture was stirred and diluted for 48 hours to obtain a polyimide precursor composition P-4 (solid content: 5 wt. %).

EXAMPLE

Example 1

The polyimide precursor composition according to Preparation Example 1 was spin-coated onto a glass substrate. The glass substrate coated with the polymer solution was placed in an oven, heated up to 470° C. at 3° C./min, and maintained at 470° C. for 10 minutes to form a first polyimide resin layer (thickness of 10 μm).

A first inorganic material layer ($SiO_2$, thickness: 5,000 Å) was formed on the first polyimide resin layer by a plasma chemical vapor deposition method.

The polyamide precursor composition according to Preparation Example 1 was spin-coated on the first inorganic layer, then placed in an oven, heated up to 470° C. at 3° C./min, and maintained at 470° C. for 10 minutes to form a second polyimide A resin layer (thickness of 6 μm).

Subsequently, a second inorganic material layer ($SiO_2$, thickness: 3,000 Å) was formed on the second polyimide resin layer by a plasma chemical vapor deposition method.

Example 2

This was prepared in the same manner as in Example 1, except that in the formation of the second polyimide resin layer, the polyimide precursor composition according to Preparation Example 2 was used instead of the polyimide precursor composition according to Preparation Example 1.

Example 3

This was prepared in the same manner as in Example 1, except that in the formation of the second polyimide resin layer, the polyimide precursor composition according to Preparation Example 3 was used instead of the polyimide precursor composition according to Preparation Example 1.

Example 4

This was prepared in the same manner as in Example 1, except that the first polyimide resin layer was formed in a thickness of 2 μm, and the second polyimide resin layer was formed in a thickness of 10 μm by using the polyimide precursor composition according to Preparation Example 2 instead of the polyimide precursor composition according to Preparation Example 1.

Example 5

This was prepared in the same manner as in Example 1, except that the first polyimide resin layer was formed in a thickness of 5 μm, and the second polyimide resin layer was formed in a thickness of 10 μm by using the polyimide precursor composition according to Preparation Example 2 instead of the polyimide precursor composition according to Preparation Example 1.

COMPARATIVE EXAMPLE

Comparative Example 1

This was prepared in the same manner as in Example 1, except that in the formation of the first polyimide resin layer, the polyimide precursor composition according to Preparation Example 2 was used instead of the polyimide precursor composition according to Preparation Example 1.

Comparative Example 2

This was prepared in the same manner as in Example 1, except that in the formation of the first polyimide resin layer, the polyimide precursor composition according to Preparation Example 2 was used instead of the polyimide precursor composition according to Preparation Example 1, and in the formation of the second polyimide resin layer, the polyimide precursor composition according to Preparation Example 3 was used instead of the polyimide precursor composition according to Preparation Example 1.

Comparative Example 3

This was prepared in the same manner as in Example 1, except that in the formation of the first polyimide resin layer, the polyimide precursor composition according to Preparation Example 3 was used instead of the polyimide precursor composition according to Preparation Example 1, and in the formation of the second polyimide resin layer, the polyimide precursor composition according to Preparation Example 3 was used instead of the polyimide precursor composition according to Preparation Example 1.

Reference Example 1

The polyimide precursor composition according to Preparation Example 1 was spin-coated onto a glass substrate. The glass substrate coated with the polymer solution was placed in an oven, heated up to 470° C. at 3° C./min, and maintained at 470° C. for 10 minutes to form a first polyimide resin layer (thickness of 10 μm).

The polyimide precursor composition according to Preparation Example 2 was spin-coated on the first polyimide resin layer, placed in an oven, heated up to 470° C. at 3° C./min, and maintained at 470° C. for 10 minutes to form a second polyimide resin layer (thickness of 6 μm).

Experimental Example

The physical properties of the substrates for display devices or flexible display devices obtained in Examples and Comparative Examples were measured by the following methods, and the results are shown in Table 1 below.

1. Coefficient of Thermal Expansion (CTE)

The polyimide precursor compositions according to Preparation Examples were spin-coated onto a glass substrate. The glass substrate coated with the polymer solution was heated up to 470° C. at 3° C./min, and maintained at 470° C. for 10 minutes to form a polyimide resin layer (thickness of 10 μm).

The polyimide resin layer samples were prepared in a size of 5 mm×20 mm, and then the samples were loaded with an accessory. The actually measured length of the polyimide resin layer was set equally to 16 mm. A force pulling a sample was set to 0.02N a primary temperature-rising step was performed at a heating rate of 5° C./min in a temperature range of 100° C. or more and 460° C. or less for Preparation Example 1 and in a temperature range of 100° C. or more and 430° C. or less for Preparation Examples 2 and 3, and then the sample was cooled at cooling rate of 4° C./min. At this time, the change in the thermal expansion was measured using TMA Q400 (TA Instruments).

2. Dielectric Constant

The saturated static charge voltages of the substrates for a display device or a flexible display device of the Examples and Comparative Examples were measured under the conditions of temperature of 25° C. and humidity of 40 to 50% according to the standard measurement method of JIS L 1094 using Shishido Electrostatic's H-0110 Honestmeter.

The applied voltage was set to 10 kV on the substrate for each manufactured display device or flexible display device. The distance from the tip of a needle electrode of the applied part to the surface of a rotating disk was adjusted to 20 mm, and the distance from the electrode plate of a power reception part to the surface of the rotating disk was adjusted to 15 mm. The applied voltage of 10 kV was started while rotating the rotating disc, and the application was completed after 100 seconds, While rotating the rotating disc in that state, the time until the static charge voltage was attenuated to half was measured. The half-life was obtained by measuring the time from when the application of high voltage was cut off to the time when the value of the potential decreased by 50% of the value of the saturated static charge voltage. The measured saturated static charge voltage and its half-life are shown in Table 1 below.

For reference, corona discharge is a discharge phenomenon that occurs by exciting and ionizing gas particles on the electrode surfaces by a high voltage when the high voltage has been applied between two electrodes.

This phenomenon occurs more often as the density of the air increases, as the voltage increases, as the temperature increases, and as the humidity decreases. When corona discharge occurs, the gas is excited and ionized by the electric field near the wire, which causes a local insulation breakdown. Thereby, the current flows and is discharged, and the electrons obtained by the electric field collide with the gas molecule, and the ionization action of the continuous gas that re-emits the electron possessed by the gas molecule occurs.

An arbitrary DC voltage is applied to the sample in the form of corona discharge, the detected value reaches a saturation value, then the high-pressure application is cut off, and the electric potential on the surface of the sample is continuously detected by the attenuation state to determine the electrostatic properties of a material. After the sample is charged in the corona discharge field, and then the time (half-life) required for the voltage to be attenuated to half is measured.

3. Heat Resistance (Td 1%, ° C.)

The temperature (° C.) when the weight reduction rate of the polyimide resin layer sample was 1% was measured under a nitrogen atmosphere using TA Instruments' Discovery TGA equipment.

Specifically, the isothermal was kept at 50° C. for 5 minutes, and after raising the temperature up to 200° C., the isothermal was kept for 30 minutes. After it was cooled to 50° C. and then stabilized, the temperature was raised to 600° C. at a rate of 10° C./min. After stabilization, the temperature when the weight reduction rate was 1% was calculated based on the mass at 100° C.

4. Haze

The haze was measured according to the measurement method of ASTM D1003 using a HAZE METER (model name: NDH7000, Nippon Denshoku).

5. Transmittance

The transmittance (T) for light with a wavelength of 470 nm was measured using a UV-vis spectrometer (Agilent, UV 8453).

TABLE 1

| Category | CTE (ppm/° C.) | Saturated static charge voltage (kV) | Half-life (s) | Td 1% (° C.) | Haze (%) | Transmittance (%) |
|---|---|---|---|---|---|---|
| Preparation Example 1 | −2.15 | 2.19 | 224 | 572.3 | 0.5 | 64 |
| Preparation Example 2 | 80.92 | 2.36 | 737 | 545 | 0.49 | 81.1 |
| Preparation Example 3 | 77.71 | 2.38 | 982 | 541 | 0.38 | 82.6 |
| Preparation Example 4 | 12.68 | 1.28 | 44 | 558 | 0.5 | 43.6 |

6. Yellowness Index (YI)

In the Examples and Comparative Examples, the yellowness index after forming each layer was measured using a color meter (GretagMacbeth's Color-Eye 7000A), and shown in Table 2 below.

Specifically, the yellowness index after forming a first polyimide resin layer on a glass substrate was measured and indicated as the "first PI resin layer" in Table 2 below.

The yellowness index after forming the first inorganic material layer on the first polyimide resin layer by a plasma chemical vapor deposition method was measured and indicated as the "first inorganic material layer" in Table 2 below.

The yellowness index after forming a second polyimide resin layer on the first inorganic material layer was measured and indicated as the "second PI resin layer" in Table 2 below.

The yellowness index after forming the second inorganic material layer on the second polyimide resin layer by a plasma chemical vapor deposition method was measured and indicated as the "second inorganic material layer" in Table 2 below.

The yellowness index after heat treatment steps of raising a temperature up to 430° C. for 2 hours, going through an isothermal process at 430° C. for 2 hours, and then cooling to 50° C. for 2 hours was measured and indicated as the "post-heat treatment" in Table 2 below.

The change in YI (%) was calculated according to the following Equation and shown in Table 2 below.

Change in YI (%)=The yellowness index after heat treatment steps of raising a temperature up to 430° C. for 2 hours, going through an isothermal process at 430° C. for 2 hours, and then cooling to 50° C. for 2 hours/The yellowness index before a heat treatment step of raising a temperature up to 430° C. for 2 hours, going through an isothermal process at 430° C. for 2 hours, and then cooling to 50° C. for 2 hours  [Equation]

7. Evaluation of Film Detachment Phenomenon

The substrate for a display device or a flexible display device obtained in Examples and Comparative Examples was heated at a rate of 3° C./min and subjected to an isothermal of 430° C. for 2 hours, and then whether a film detachment phenomenon occurred in accordance with the following criteria was visually evaluated.

○: Film detachment occurred
X: No film detachment occurred

TABLE 2

| | | Example 1 | Example 2 | Example 3 | Example 4 | Example 5 | Comparative Example 1 | Comparative Example 2 | Comparative Example 3 | Reference Example 1 |
|---|---|---|---|---|---|---|---|---|---|---|
| First PI resin layer | Preparation Example | | | Preparation Example 1 | | | Preparation Example 2 | | Preparation Example 3 | Preparation Example 1 |
| | Thickness (μm) | 10 | 10 | 10 | 2 | 5 | 10 | 10 | 10 | 10 |
| | Yellowness index | 25 | 26 | 26 | 12 | 18 | 10 | 10 | 6 | 27 |
| | First inorganic material layer (yellowness index) | 27 | 28 | 27 | 3 | 19 | 10 | 10 | 6 | — |
| Second PI resin layer | Preparation Example | Preparation Example 1 | Preparation Example 2 | Preparation Example 3 | Preparation Example 2 | Preparation Example 2 | Preparation Example 2 | Preparation Example 3 | Preparation Example 3 | Preparation Example 2 |
| | Thickness (μm) | 6 | 6 | 6 | 10 | 10 | 6 | 6 | 6 | 6 |
| | Yellow index | 36 | 28 | 28 | 22 | 28 | 16 | 15 | 11 | 32 |
| | Second inorganic material layer (yellowness index) | 36 | 29 | 30 | 23 | 29 | 16 | 15 | 12 | — |
| | Post-heat treatment (yellow index) | 46 | 36 | 34 | 28 | 33 | 85 | 101 | 201 | 36 |
| | Change in YI (%) | 128 | 126 | 113 | 117 | 114 | 528 | 680 | 1630 | 112 |
| | Occurrence of film detachment | X | X | X | X | X | ○ | ○ | ○ | X |

As shown in Tables 1 to 2 above, it was confirmed that the substrates for a display device or a flexible display device of Examples have long half-life and high resistance characteristics while exhibiting excellent heat resistance and optical characteristics. In particular, it was confirmed that the optical characteristics such as yellowness index and transmittance do not change significantly even after going through a high temperature process of 430° C. or more, and the deformation of the morphology of individual layers or the morphology of the laminated structure is not large.

On the other hand, it was confirmed that the substrates for display devices or flexible display devices of Comparative Examples are inferior in optical characteristics and heat resistance as compared with Examples, particularly, after high-temperature treatment, the yellowness index greatly increases or the film detachment occurs, which causes defects in the internal laminate structure.

In addition, it was confirmed that in the substrate for a display device or a flexible display device of Reference Example 1, as the second polyimide resin layer is formed directly on the first polyimide resin layer without an inorganic material layer, the yellowness index is equivalent to that of Examples, but gas barrier properties and moisture permeability properties are low, and air and moisture are not blocked, and the device stability is deteriorated, which is not suitable as a substrate for a display device or a flexible display device.

The invention claimed is:

1. A substrate for a display device or a flexible display device comprising:
   a first polyimide resin layer having a Td 1% of 570° C. or more and a yellowness index of 25 or more and 60 or less;
   a second polyimide resin layer having a yellowness index of less than 25;
   a first inorganic material layer disposed between the first polyimide resin layer and the second polyimide resin layer and having a thickness of 100 nm or more and 700 nm or less; and
   a second inorganic material layer formed on the second polyimide resin layer and having a thickness of 100 nm or more and 500 nm or less,
   wherein the yellowness index of each of the first polyimide resin layer and the second polyimide resin layer is measured based on a thickness of 10±1 μm.

2. The substrate for a display device or a flexible display device according to claim 1, wherein:
   an initial yellowness index of the whole substrate for the display device or the flexible display device is 36 or less.

3. The substrate for a display device or a flexible display device according to claim 1, wherein:
   with respect to the whole substrate for the display device or the flexible display device, the yellowness index after heat treatment steps of raising a temperature up to 430° C. for 2 hours, going through an isothermal process at 430° C. for 2 hours, and then cooling to 50° C. for 2 hours is 50 or less.

4. The substrate for a display device or a flexible display device according to claim 3, wherein:
the yellowness index after the heat treatment steps is 30 or more and 50 or less.

5. The substrate for a display device or a flexible display device according to claim 3, wherein:
based on an initial yellowness index of the whole substrate for the display device or the flexible display device, a percentage of the yellowness index after the heat treatment steps is 130% or less.

6. The substrate for a display device or a flexible display device according to claim 1, wherein:
the first polyimide resin layer has a thickness of 1 μm to 10 μm, and
the second polyimide resin layer has a thickness of 0.5 μm to 6 μm.

7. The substrate for a display device or a flexible display device according to claim 1, wherein:
the first polyimide resin layer has a thickness of 1 μm to 6 μm, and
the second polyimide resin layer has a thickness of 6 μm to 15 μm.

8. The substrate for a display device or a flexible display device according to claim 1, wherein:
the second polyimide resin layer has Td 1% of 500° C. or more and 560° C. or less.

9. The substrate for a display device or a flexible display device according to claim 1, wherein:
the first polyimide resin layer and the second polyimide resin layer each have
a transmittance of 50% or more at a wavelength of 470 nm, and
a haze of 1.0% or less.

10. The substrate for a display device or a flexible display device according to claim 1, wherein:
the second polyimide resin layer comprises a polyimide resin containing a repeating unit derived from a diamine substituted with a fluorine-based functional group.

11. The substrate for a display device or a flexible display device according to claim 1, wherein:
the second polyimide resin layer comprises a polyimide resin containing a repeating unit represented by the following Chemical Formula 1:

[Chemical Formula 1]

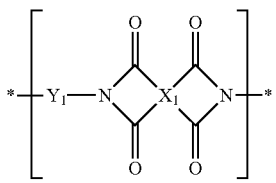

wherein, in the Chemical Formula 1,
$X_1$ is an aromatic tetravalent functional group, and
$Y_1$ is an aromatic divalent functional group in which at least one fluorine-based functional group is substituted.

12. The substrate for a display device or a flexible display device according to claim 11, wherein:
the second polyimide resin layer further comprises a repeating unit represented by the following Chemical Formula 1-1:

[Chemical Formula 1-1]

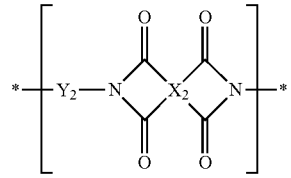

wherein, in the Chemical Formula 1-1,
$X_2$ is an aromatic tetravalent functional group, and
$Y_2$ is an aromatic divalent functional group different from that of $Y_1$ of Chemical Formula 1.

13. The substrate for a display device or a flexible display device according to claim 11, wherein:
the aromatic divalent functional group of the $Y_1$ in which at least one fluorine-based functional group is substituted comprises a functional group represented by the following Chemical Formula 3-1:

[Chemical Formula 3-1]

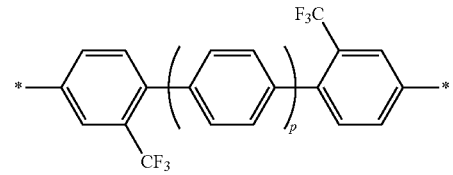

wherein, in the Chemical Formula 3-1,
P is an integer of 0 or more and 5 or less.

14. The substrate for a display device or a flexible display device according to claim 1, wherein:
the first polyimide resin layer comprises a polyimide resin containing a repeating unit derived from a diamine unsubstituted with a fluorine-based functional group.

15. A display device or a flexible display device comprising the substrate for a display device or a flexible display device as set forth in claim 1.

* * * * *